United States Patent
Cai et al.

(10) Patent No.: US 9,530,775 B2
(45) Date of Patent: *Dec. 27, 2016

(54) METHODS OF FORMING DIFFERENT FINFET DEVICES HAVING DIFFERENT FIN HEIGHTS AND AN INTEGRATED CIRCUIT PRODUCT CONTAINING SUCH DEVICES

(71) Applicants: GLOBALFOUNDRIES Inc., Grand Cayman (KY); International Business Machines Corporation, Armonk, NY (US)

(72) Inventors: Xiuyu Cai, Niskayuna, NY (US); Ruilong Xie, Niskayuna, NY (US); Kangguo Cheng, Schenectady, NY (US); Ali Khakifirooz, Mountain View, CA (US)

(73) Assignees: GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 479 days.

This patent is subject to a terminal disclaimer.

(21) Appl. No.: 13/916,013

(22) Filed: Jun. 12, 2013

(65) Prior Publication Data
US 2014/0367795 A1 Dec. 18, 2014

(51) Int. Cl.
*H01L 21/8238* (2006.01)
*H01L 27/092* (2006.01)
*H01L 27/088* (2006.01)
*H01L 21/8234* (2006.01)
*H01L 29/66* (2006.01)
*H01L 29/78* (2006.01)

(52) U.S. Cl.
CPC ... *H01L 27/0886* (2013.01); *H01L 21/823431* (2013.01); *H01L 21/823481* (2013.01); *H01L 21/823821* (2013.01); *H01L 21/823878* (2013.01); *H01L 29/66795* (2013.01); *H01L 29/7851* (2013.01)

(58) Field of Classification Search
CPC .................. H01L 21/823821; H01L 29/66795; H01L 29/7851
USPC .................................... 438/212; 257/E21.442
See application file for complete search history.

(56) References Cited

U.S. PATENT DOCUMENTS

2013/0224936 A1* 8/2013 Lee ................... H01L 21/82382
438/492

* cited by examiner

*Primary Examiner* — Marcos D Pizarro
(74) *Attorney, Agent, or Firm* — Amerson Law Firm, PLLC

(57) ABSTRACT

One illustrative method disclosed herein includes forming a plurality of trenches in a plurality of active regions of a substrate that defines at least a first plurality of fins and a second plurality of fins for first and second FinFET devices, respectively, forming liner materials adjacent to the first and second plurality of fins, wherein the liner materials adjacent the first fins and the second fins have a different thickness. The method also includes removing insulating material to expose portions of the liner materials, performing an etching process to remove portions of the liner materials so as to expose at least one fin in the first plurality of fins to a first height and at least one of the second plurality of fins to a second height that is different from the first height.

20 Claims, 5 Drawing Sheets

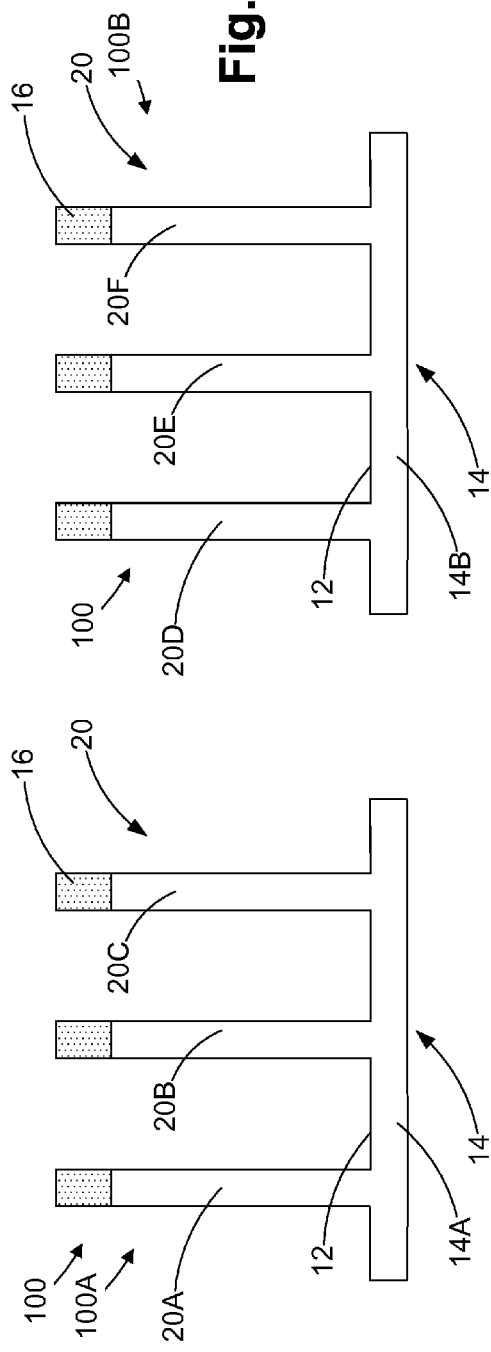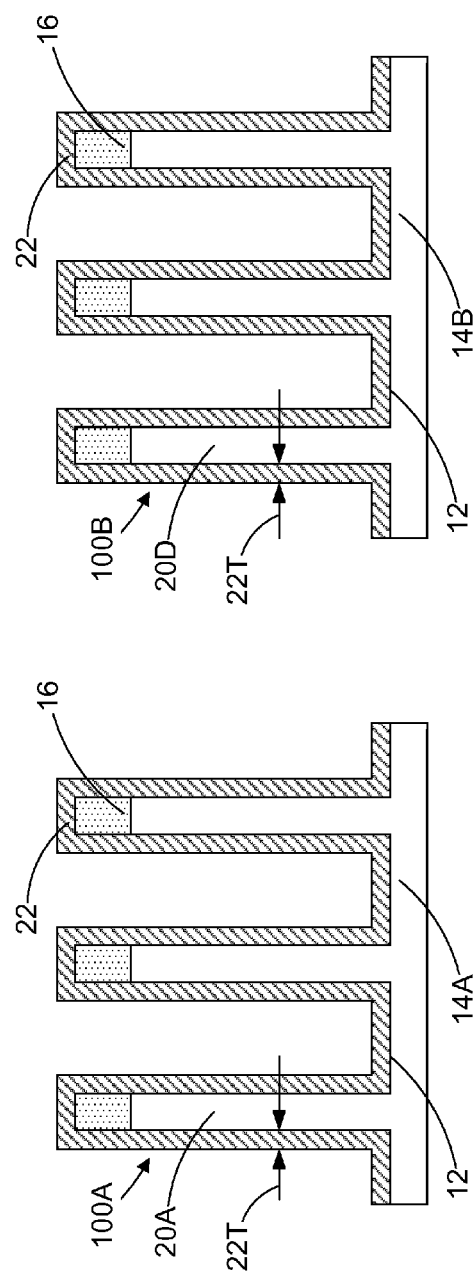

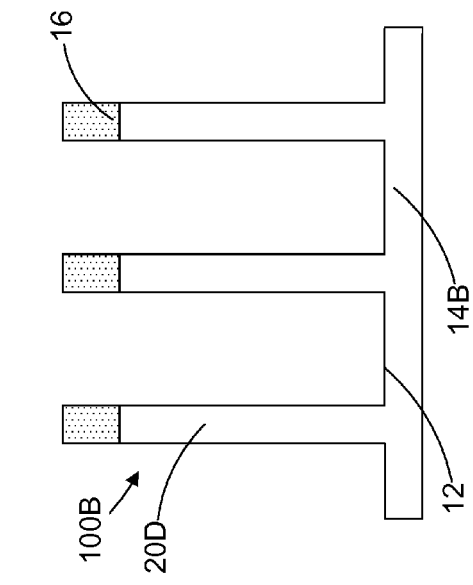
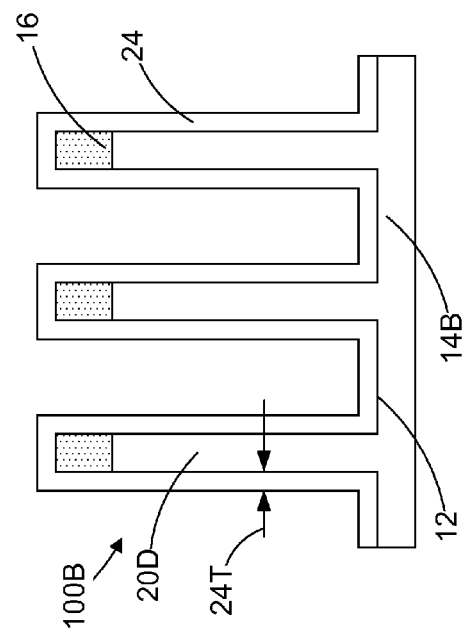
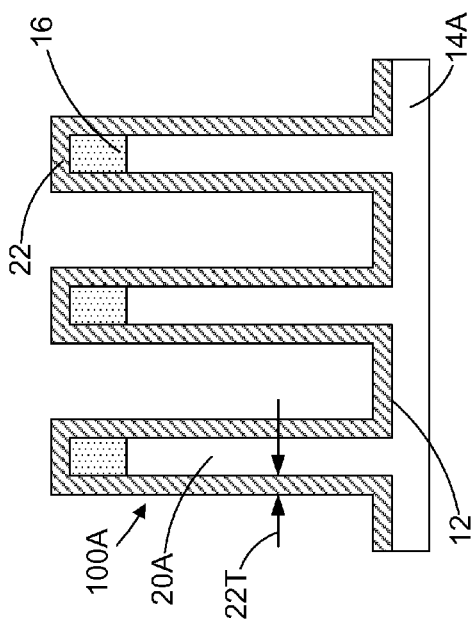
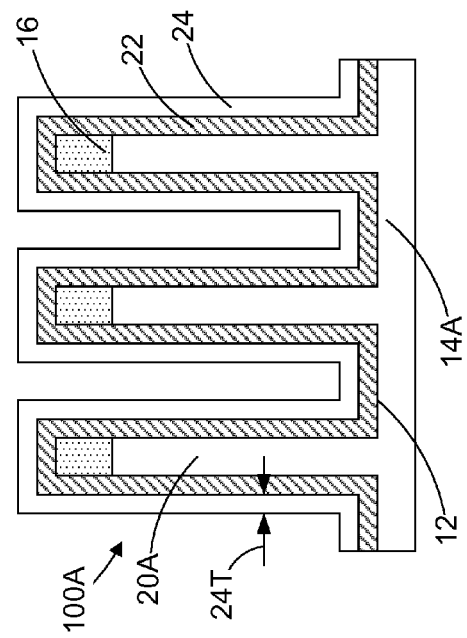

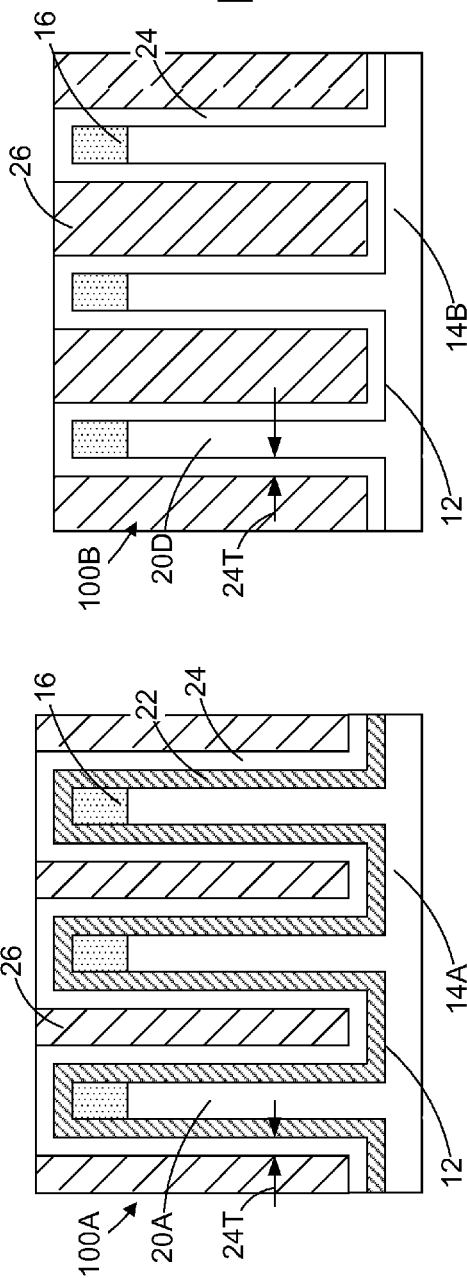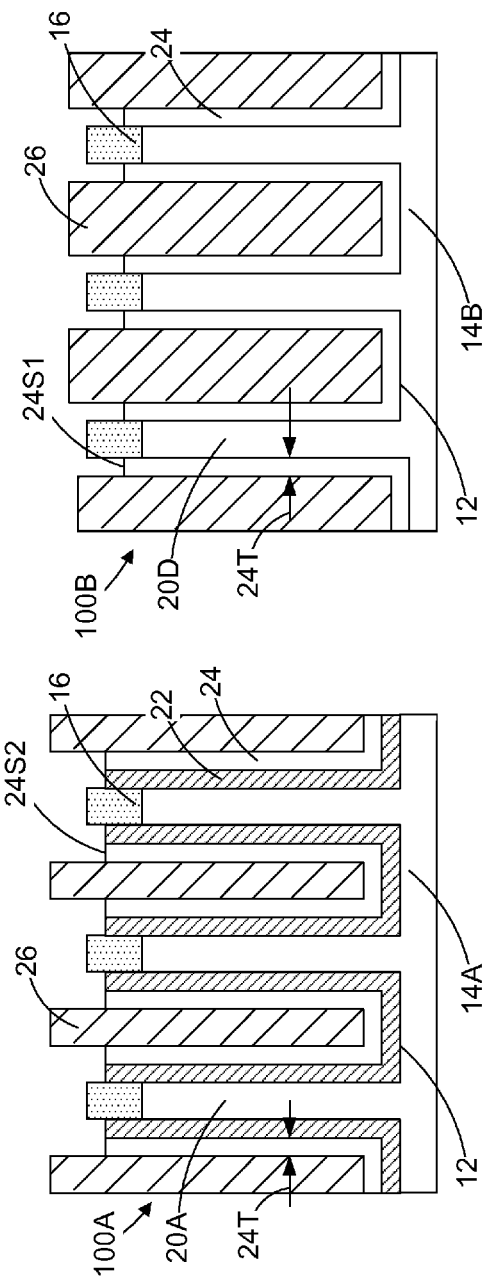

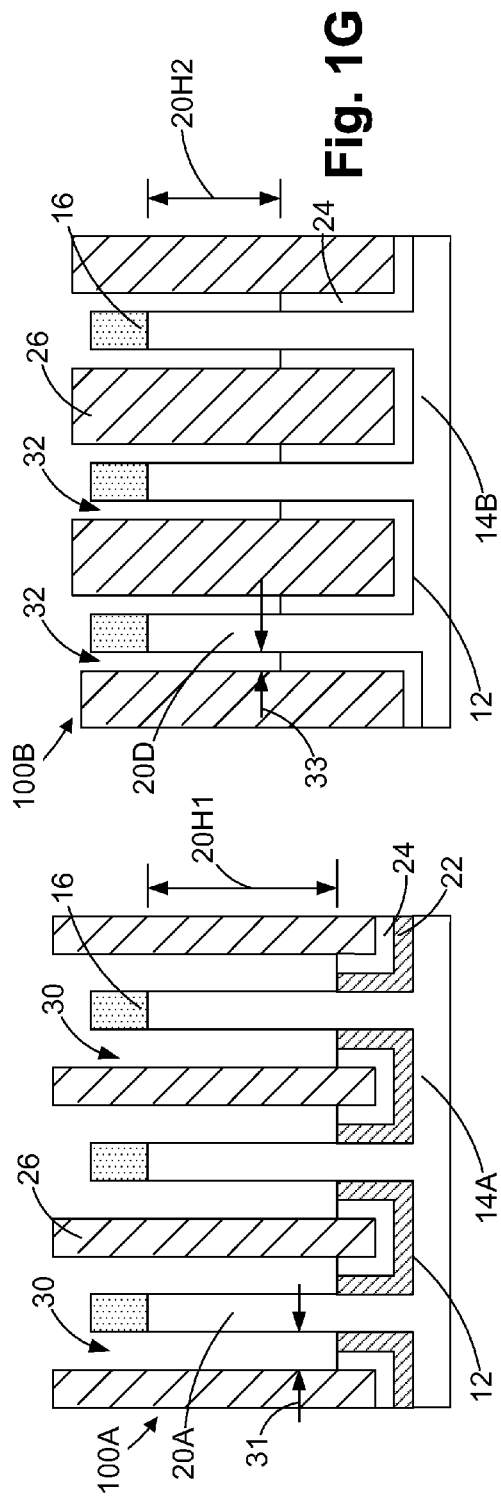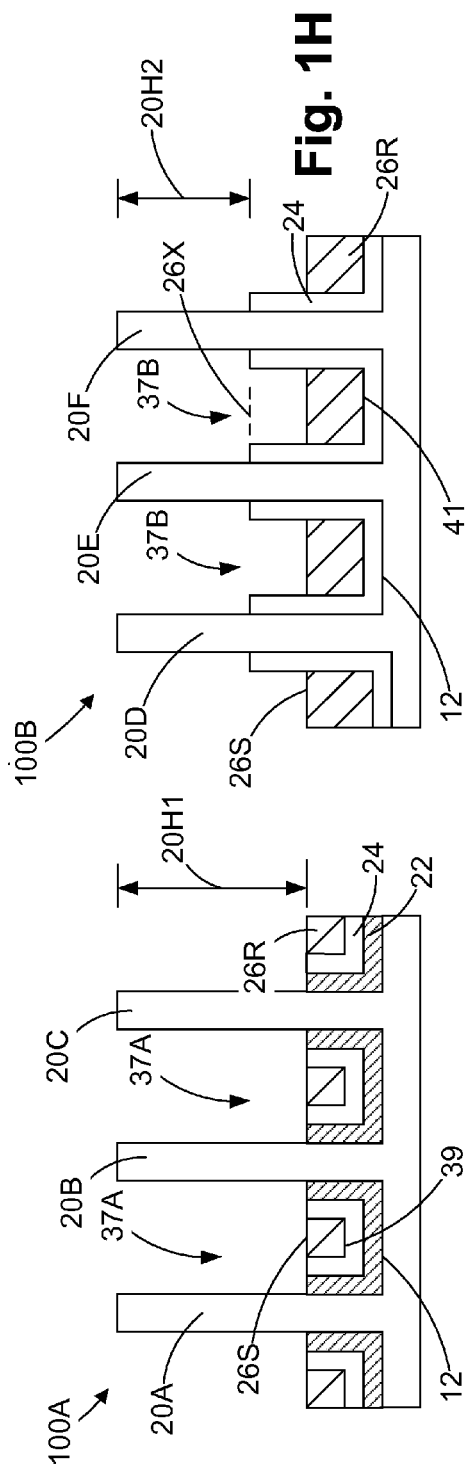

METHODS OF FORMING DIFFERENT FINFET DEVICES HAVING DIFFERENT FIN HEIGHTS AND AN INTEGRATED CIRCUIT PRODUCT CONTAINING SUCH DEVICES

BACKGROUND OF THE INVENTION

1. Field of the Invention

Generally, the present disclosure relates to the manufacture of semiconductor devices, and, more specifically, to various methods of forming 3D semiconductor devices, such as FinFET devices, wherein different FinFET devices have different fin heights, and to an integrated circuit product that contains such FinFET devices.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region. Current flow through the FET is controlled by controlling the voltage applied to the gate electrode. If there is no voltage applied to the gate electrode, then there is no current flow through the device (ignoring undesirable leakage currents, which are relatively small). However, when an appropriate voltage is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects. When an appropriate voltage is applied to the gate electrode of a FinFET device, the surfaces (and the inner portion near the surface) of the fins, i.e., the substantially vertically oriented sidewalls and the top upper surface of the fin with inversion carriers, contributes to current conduction. In a FinFET device, the "channel-width" is approximately two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly stronger drive currents than planar transistor devices. Additionally, the leakage current of FinFET devices after the device is turned "OFF" is significantly reduced as compared to the leakage current of planar FETs due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

One process flow that is typically performed to form FinFET devices involves forming a plurality of trenches in the substrate to define the areas where STI regions will be formed and to define the initial structure of the fins. These trenches are typically formed in the substrate during the same process operation for processing simplicity. The trenches have a target depth that is sufficient for the needed fin height and deep enough to allow formation of an effective STI region. After the trenches are formed, a layer of insulating material, such as silicon dioxide, is formed so as to overfill the trenches. Thereafter, a chemical mechanical polishing (CMP) process is then performed to planarize the upper surface of the insulating material with the top of the fins (or the top of a patterned hard mask). Thereafter, an etch-back process is performed to recess the layer of insulating material between the fins and thereby expose the upper portions of the fins, which corresponds to the final fin height of the fins.

Given the way that fins are typically formed, a conventional FinFET device has a fixed fin height, i.e., all of the fins have the same height. Thus, the total channel width of a multiple fin FinFET device is equal to the number of fins ("X") times the channel width provided by each fin, i.e., each fin provides a channel length equal to two times (2×) the vertical fin-height plus the width of the top surface of the fin. That is, the total channel width of a multiple fin device is fixed by the fin height and number of fins. Importantly, using traditional manufacturing techniques, a FinFET device with multiple fins, e.g., a two-fin device, cannot be manufactured such that the total channel width of the device is equal to, for example, 1.5 times the total height of the two fins in the two-fin device. This lack of flexibility in manufacturing FinFET devices provides designers with less flexibility than would otherwise be desired in designing complex integrated circuits.

In designing digital circuits, one parameter that is very important is the desired drive current produced by individual transistors (FETs and/or FinFETs) and the overall drive current needed or produced by a given circuit arrangement. In circuits involving planar FETs, device designers can produce FETs that generate a virtually desired fractional level of drive current. That is, for planar FETs, the drive current of the FET may be readily adjusted to virtually any value by simply changing the gate width of the planar FET. For example, if a designer desires a FET with ½ strength drive current, then the gate width of a planar FET with an integer drive strength of 1 is simply reduced by half. Similarly, if twice the drive strength of a planar FET is required, then the gate width of the FET is doubled. Of course, increasing the gate width of a planar FET device consumes more plot space, but the ability to produce planar FETs with desired fractional drive currents gives device designers great flexibility in designing integrated circuits. Many digital and analog circuits are based upon designs that involve fractional drive current strengths. However, as discussed above, with FinFETs, the channel width is fixed by the height of the fin.

Additionally, for some integrated circuit products, it is necessary that one FinFET based device produce more drive current than another FinFET device in the same circuit. For example, in an SRAM product, there is an optimized drive current ratio between the so-called pass-gate transistor, pull-up transistor and pull-down transistor. In practical terms, given the fixed fin height of FinFET devices, the pass-gate transistor must be physically different in plot-space size than the pull-up transistor to get the desired difference in drive current, e.g., the transistors consume different amounts of plot space on the substrate. Unfortunately, this size differential can adversely affect patterning operations as etching processes may be affected by locally varying densities in circuit features. Such variations in the resulting device structures can adversely affect device performance.

Device manufacturers are under constant pressure to produce integrated circuit products with increased performance and lower production costs relative to previous device generations. Thus, device designers spend a great amount of time in an effort to maximize device performance while seeking ways to reduce manufacturing costs and improve manufacturing reliability. As it relates to 3D devices, device designers have spent many years and employed a variety of techniques in an effort to improve the performance capability and reliability of such devices.

The present disclosure is directed to various methods of forming 3D semiconductor devices, such as FinFET devices, wherein different FinFET devices have different fin heights, and to an integrated circuit product that contains such FinFET devices that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming 3D semiconductor devices, such as FinFET devices, wherein different FinFET devices have different fin heights, and to an integrated circuit product that contains such FinFET devices. One illustrative method disclosed herein for forming an integrated circuit product includes performing at least one first etching process through a patterned mask layer to form a plurality of trenches in a plurality of active regions of the substrate that defines at least a first plurality of fins and a second plurality of fins for first and second FinFET devices, respectively, forming liner material adjacent to the first plurality of fins to a first thickness, forming liner material adjacent to the second plurality of fins to a second thickness that is different from the first thickness, and forming insulating material in the trenches adjacent the liner materials and above the mask layer. The method also includes performing at least one process operation to remove portions of the layer of insulating material and to expose portions of the liner materials, performing at least one second etching process to remove portions of the liner materials and the mask layer so as to expose at least one fin in the first plurality of fins to a first height and at least one of the second plurality of fins to a second height that is different from the first height, performing at least one third etching process on the insulating material to thereby define a reduced-thickness layer of insulating material and forming gate structures around the first plurality of fins and the second plurality of fins.

One illustrative integrated circuit product disclosed herein includes a first FinFET device formed above a first active region of a semiconductor substrate, wherein the first FinFET device includes a first plurality of fins, and wherein at least one of the first plurality of fins has a first fin height, a first trench positioned between the first plurality of fins, wherein the first trench has a first generally U-shaped liner material positioned in a bottom of the first trench, and a second FinFET device formed above a second active region of the semiconductor substrate, wherein the second FinFET device includes a second plurality of fins, wherein at least one of the second plurality of fins has a second fin height that is different from the first fin height and a second trench positioned between the second plurality of fins, wherein the second trench has a second generally U-shaped liner material positioned in a bottom of the second trench.

Another illustrative integrated circuit device disclosed herein includes a first FinFET device positioned above a first active region of a semiconductor substrate, wherein the first FinFET device includes at least one first fin having a first fin height, and a second FinFET device positioned above a second active region of the semiconductor substrate, wherein the second FinFET device includes at least one second fin having a second fin height, wherein the first and second fin heights are different.

BRIEF DESCRIPTION OF THE DRAWINGS

The disclosure may be understood by reference to the following description taken in conjunction with the accompanying drawings, in which like reference numerals identify like elements, and in which:

FIGS. 1A-1I depict various illustrative methods disclosed herein for forming different FinFET devices such that they have different fin heights and to an integrated circuit product that contains such FinFET devices.

Figure 1I:
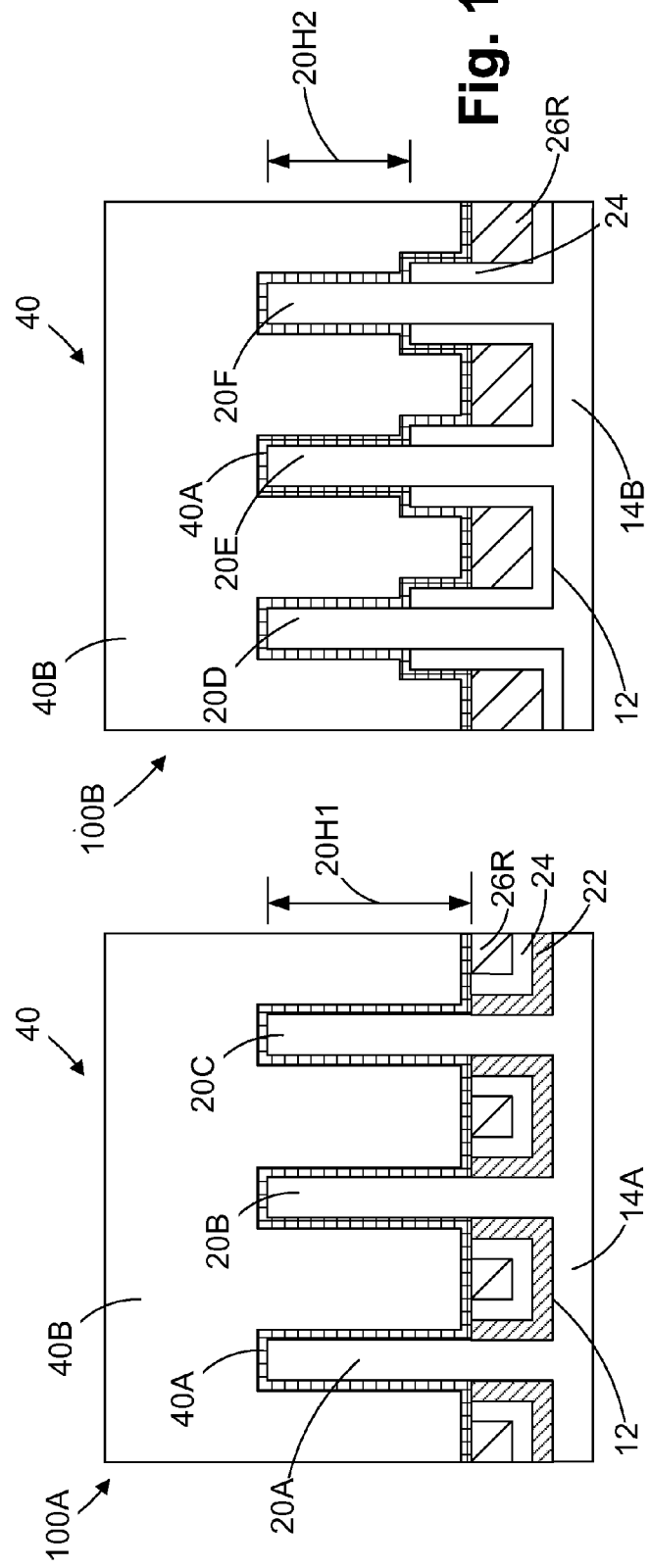

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present disclosure is directed to various methods of forming 3D semiconductor devices, such as FinFET devices, wherein different FinFET devices have different fin heights, and to an integrated circuit product that contains such FinFET devices. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. With reference to the attached figures, various illustrative embodiments of the methods and devices disclosed herein will now be described in more detail.

The attached drawings depict one illustrative embodiment of a novel integrated circuit product 100 that is generally comprised of a first FinFET device 100A and a second FinFET device 100B that are formed above separate active regions 14A, 14B, respectively, of a semiconductor substrate 14. As will be recognized by those skilled in the art after a complete reading of the present application, the FinFET devices 100A, 100B may be either the same type device, e.g., both N-type devices, or they may be opposite type devices, i.e., one a P-type device and one an N-type device. In one particular example, one of the devices 100A, 100B may be a so-called pull-down transistor of an SRAM circuit, while the other device may be a so-called pass-gate transistor of such an SRAM circuit. As described more fully below, the methods disclosed herein provide device designers with more flexibility as it relates to manufacturing integrated circuit products. As one example, the methods disclosed herein that enable formation of different FinFET devices with different fin heights may allow devices designers to make the FinFET devices 100A, 100B the same physical size (so that they consume the same amount of plot space on the substrate), yet still produce different drive currents by virtue of adjusting the fin heights on the two devices to different heights. Such uniformity in the size of the FinFET devices 100A, 100B may make integrated circuit fabrication easier and may result in fewer errors due to the substantial uniformity in the size of the FinFET devices 100A, 100B. Additional advantages of the methods and products disclosed herein will be appreciated by those skilled in the art after a complete reading of the present application.

FIG. 1A schematically depicts one illustrative embodiment of a novel integrated circuit product 100 disclosed herein at a point of fabrication wherein a plurality of trenches 12 have been formed in both of the active regions 14A, 14B of a bulk semiconducting substrate 14 by performing at least one etching process through a patterned hard mask layer 16, e.g., a patterned layer of silicon nitride. This results in the formation of a plurality of illustrative fins 20 in the substrate 14. A first group of fins 20A-C is formed above the first active region 14A where the FinFET device 100A will be formed, while a second group of fins 20D-F are formed above the second active region 14B where the FinFET device 100B will be formed. As noted above, each of the FinFET devices 100A, 100B may be either an N-type device or a P-type FinFET device, and they may be formed using either so-called "gate-first" or "replacement gate" ("gate-last") techniques. In the examples depicted herein, the illustrative FinFET devices 100A, 100B will be comprised of three illustrative fins 20, i.e., fins 20A-C for the first FinFET device 100A and fins 20D-F for the second FinFET device 100B. However, as will be recognized by those skilled in the art after a complete reading of the present application, the presently disclosed inventions may be employed in manufacturing FinFET devices having any desired number of fins. Moreover, the FinFET devices 100A, 100B need not each have the same number of fins 20, although such a situation may occur in some applications. The depicted active regions 14A, 14B may be adjacent one another on the substrate 14 or they may be spaced apart from one another by any desired distance. Isolation regions (not shown) may be formed for the FinFET devices 100A, 100B after the formation of the trenches 12 using techniques that are well known to those skilled in the art. So as not to obscure the present invention, such isolation regions that are formed to electrically isolate the FinFET devices 100A, 100B from one another are not depicted in the attached drawings.

The substrate 14 may have a variety of configurations, such as the depicted bulk substrate configuration. The substrate 14 may be made of silicon or it may be made of materials other than silicon. Thus, the terms "substrate" or "semiconducting substrate" should be understood to cover all semiconducting materials and all forms of such materials. Additionally, the overall size, shape and configuration of the trenches 12 and fins 20 may vary depending on the particular application. The depth and width of the trenches 12 may also vary depending upon the particular application. In one illustrative embodiment, based on current-day technology, the depth of the trenches 12 may range from approximately 30-200 nm and the width of the trenches 12 may range from about 20-50 nm. In some embodiments, the fins 20 may have a width within the range of about 5-30 nm. In the illustrative examples depicted in most of the attached drawings, the trenches 12 and fins 20 are all of a uniform size and shape. However, as discussed more fully below, such uniformity in the size and shape of the trenches 12 and the fins 20 is not required to practice at least some aspects of the inventions disclosed herein. In the attached figures, the trenches 12 are depicted as having been formed by performing an anisotropic etching process that results in the trenches 12 having a schematically depicted, generally rectangular configuration. In an actual real-world device, the sidewalls of the trenches 12 may be somewhat inwardly tapered, although that configuration is not depicted in the attached drawings. In some cases, the trenches 12 may have a reentrant profile near the bottom of the trenches 12. To the extent the trenches 12 are formed by performing a wet etching process, the trenches 12 may tend to have a more rounded configuration or non-linear configuration as compared to the generally rectangular configuration of the trenches 12 that are formed by performing an anisotropic etching process. Thus, the size and configuration of the trenches 12, and the manner in which they are made, as well as the general configuration of the fins 20, should not be considered a limitation of the present invention. For ease of disclosure, only the substantially rectangular trenches 12 will be depicted in the subsequent drawings.

The patterned hard mask layer 16 is intended to be representative in nature as it may be comprised of a variety of materials, such as, for example, silicon nitride, silicon oxynitride, $Al_2O_3$, $HfO_2$, etc. Moreover, the patterned hard mask layer 16 may be comprised of multiple layers of material. The patterned hard mask layer 16 may be formed by depositing the layer(s) of material that comprise the patterned hard mask layer 16 and thereafter directly patterning the patterned hard mask layer 16 using known photolithography and etching techniques. Alternatively, the patterned hard mask layer 16 may be formed by using known sidewall image transfer techniques. Thus, the particular form and composition of the patterned hard mask layer 16 and the manner in which it is made should not be considered a limitation of the present invention. In the case where the patterned hard mask layer 16 is comprised of one or more hard mask layers, such layers may be formed by performing a variety of known processing techniques, such as a chemical vapor deposition (CVD) process, an atomic layer deposition (ALD) process, an epitaxial deposition process (EPI), or plasma enhanced versions of such processes, and the thickness of such a layer(s) may vary depending upon the particular application.

FIG. 1B depicts the integrated circuit product 100 after a conformal deposition process, e.g., a chemical vapor deposition (CVD) process, an atomic layer deposition (ALD) process, etc., has been performed to form a first liner layer 22 on the fins 20 and in the trenches 12 for both the first FinFET device 100A and the second FinFET device 100B. More specifically, in the depicted example, the first liner layer 22 is formed above the patterned hard mask layer 16, on the sidewalls of all of the fins 20 (20A-F) and in the trenches 12 in both active regions 14A-B. The thickness 22T of the first liner layer 22 may vary depending upon the particular application, e.g., it may have a thickness of about 2-5 nm. As described more fully below, using the processes described herein and in the illustrative embodiment depicted herein, the fin height of the fins 20A-C of the first FinFET device 100A are set, based in part, by selecting the desired thickness 22T of the first liner layer 22. In general, the first liner layer 22 may be made of a material that may be selectively etched relative to the insulating material that will be used to fill the portions of the trenches 12 in a later process operation. For example, the first liner layer 22 may be comprised of silicon nitride, silicon carbon nitride, silicon boron nitride, a doped nitride, silicon oxynitride, $Al_2O_3$, $HfO_2$, boron or phosphorous doped silicon dioxide, etc. The basic principle involved is that the liner layer 22 needs to be selectively etchable relative to the hard mask 16 and the insulating material that will ultimately be formed to fill the remaining portions of the trenches 12 in a subsequent process operation to be more fully described below. In one particularly illustrative embodiment, the patterned hard mask layer 16 may be made of silicon nitride and the first liner layer 22 may be made of aluminum oxide.

FIG. 1C depicts the integrated circuit product 100 after several process operations have been performed. First, a patterned masking layer (not shown), e.g., a patterned photoresist mask, was formed above the first FinFET device 100A and exposed the second FinFET device 100B for further processing, i.e., the portions of the first liner layer 22 above the fins 20D-F was exposed for further processing. Thereafter, an etching process was performed through the patterned mask layer to remove the first liner layer 22 formed above the second active region 14B. Thereafter, the masking layer was removed. Such processing operations result in the structure depicted in FIG. 1C. Importantly, this etching process clears the liner material from the sidewalls of the fins 20D-F of the second FinFET device 100B while leaving the liner material on the fins 20A-C of the first FinFET device 100A. Of course, if desired, the masking layer could have equally been formed above the second FinFET device 100B and the liner material could have been removed from the fins 20A-C of the first FinFET device 100A. Thus, the present invention should not be considered to be limited to performing the process operations in the order depicted herein, or on the particular devices shown in the illustrative processing sequence depicted herein.

FIG. 1D depicts the integrated circuit product 100 after another conformal deposition process, e.g., a chemical vapor deposition (CVD) process, an atomic layer deposition (ALD) process, etc., has been performed to form a second liner layer 24 above the remaining portion of the first liner layer 22 on the fins 20A-C of the first FinFET device 100A and in the trenches 12 adjacent the exposed fins 20D-F of the second FinFET device 100B. The thickness 24T of the second liner layer 24 may vary depending upon the particular application, e.g., it may have a thickness of about 2-5 nm. In some cases, the thickness 24T of the second liner layer 24 may be about the same as the thickness 22T (FIG. 1B) of the first liner layer 22, although such a situation is not required to practice the inventions disclosed herein. As described more fully below, using the processes described herein, the fin height of at least some of the fins 20A-C of the first FinFET device 100A are set, based, in part, upon the combined thicknesses 22T, 24T of the first and second liner layers 22, 24, respectively, while the fin height of at least some of the fins 20D-F are set, based, in part, upon the thickness 24T of only the second liner layer 24. In general, the second liner layer 24 may be made of a material that may be selectively etched relative to the insulating material that will be used to fill the portions of the trenches 12 in a later process operation. For example, the second liner layer 24 may be comprised of silicon nitride, silicon carbon nitride, silicon boron nitride, a doped nitride, silicon oxynitride, $Al_2O_3$, $HfO_2$, boron or phosphorous doped silicon dioxide, etc. In some cases, the first liner layer 22 and the second liner layer 24 may be made of the same material, although such a situation is not required to practice the inventions disclosed herein. In one particularly illustrative embodiment, the patterned hard mask layer 16 may be made of silicon nitride, while the first liner layer 22 and the second liner layer 24 may both be made of aluminum oxide.

FIG. 1E depicts the integrated circuit product 100 after several process operations have been performed. First, a layer of insulating material 26 was deposited so as to overfill the trenches 12 in both the first and second active regions 14A, 14B and, thereafter, a CMP process was performed on the layer of insulating material 26 in an effort to planarize the upper surface of the layer of insulating material 26. In the case where the active regions 14A, 14B are spaced apart from one another, the CMP process results in the substantially planar upper surfaces depicted in FIG. 1E. In the case where the first and second active regions 14A, 14B are formed adjacent to one another (a situation not shown in the attached drawings), due to the presence of the first liner layer 22 and the second liner layer 24 above the fins 20A-C, and the absence of the first liner layer 22 above the fins 20D-F, there may be some dishing (not shown) of the layer of insulating material 26 in the transition region between the active regions 14A, 14B. In the depicted example, the CMP process stops on the second liner layer 24. The layer of insulating material 26 may be comprised of a variety of different materials, such as silicon dioxide, doped silicon dioxide (doped with carbon, boron or phosphorous), etc., and it may be formed by performing a variety of techniques, e.g., chemical vapor deposition (CVD), etc. Instead of a CMP process, an etch-back process could be performed on the layer of insulating material 26 to arrive at substantially the same structure as depicted in FIG. 1E.

FIGS. 1F-1G depict an etching process sequence that is performed on the integrated circuit product 100. Initially, if desired, an optional oxide deglaze etching process may be performed to insure that all of the insulating material 26, e.g., silicon dioxide, is removed from the upper surfaces of the second liner layer 24. In general, the etching process sequence is performed to remove the patterned hard mask 16 and portions of the first and second liner layers 22, 24 selectively relative to the insulating material 26. Initially, as shown in FIG. 1F, during a first portion of the etching sequence, portions of the first and second liner layers 22, 24 are removed to expose the patterned hard mask layer 16. Depending upon the material of constructions of the patterned hard mask 16 and the first and second liner layers 22, 24, some of the patterned hard mask layer 16 may be consumed at the point of fabrication depicted in FIG. 1F, although such consumption in not depicted in the drawings. At this point in the etching sequence, portions of the liner materials, i.e., the liners 22 and/or 24, positioned in the trenches 12 are exposed. Due to the presence of the first liner layer 22 above the fins 20A-C of the first FinFET device 100A, after this initial portion of the etching sequence, the surface 24S1 of the second liner layer 24 in the area around the fins 20D-F of the second FinFET device 100B is at a level that is below the surface 24S2 of the second liner layer 24 in the area around the fins 20A-C of the first FinFET device 100A.

FIG. 1G depicts the integrated circuit product 100 at the end of the etching process sequence wherein the first and second liner layers 22, 24 have been recessed sufficiently to establish the final exposed first fin height 20H1 for the fins 20A-C of the first FinFET device 100A and a second exposed fin height 20H2 for the fins 20D-F of the second FinFET device 100B, wherein the first fin height 20H1 is greater than the second fin height 20H2. In the depicted example, the etching process sequence results in cavities 30 adjacent the fins 20A-C of the first FinFET device 100A and cavities 32 adjacent the fins 20D-F of the second FinFET device 100B. The liner material(s) in the trenches 12 adjacent the fins 20A-C of the first FinFET device 100A has a thickness 31 that is greater than the thickness 33 of the liner material(s) in the trenches 12 adjacent the fins 20D-F of the second FinFET device 100B. In general, in forming the cavities 30, 32, the etch rate of the liner materials (liner 22 and/or 24 as the case may be) in the above-described liner material recessing etch process increases as the width of the cavities 30, 32 increases, which provides a means to effectively control the depth of the liner recess. That is, due to the greater width 31 of the liner material(s) in the cavities 30 as compared to the width 33 of the liner material(s) in the cavities 32, the depth of the cavities 30 will be greater than the depth of the cavities 32, which provides an effective means to control the final fin heights 20H1, 20H2 of the fins 20 in the FinFET devices 100A, 100B, respectively. The difference in the effective etch rate of the etch process in the cavities 30, 32 occupied by the liner materials of different thicknesses may be referred to as a so-called capillary effect. It should also be noted that the control of the fin heights 20H1, 20H2 is not dependent upon the fin pitch of FinFET devices 100A, 100B that may be located in different regions of the integrated circuit product 100, since the fin heights 20H1, 20H2 are based upon applying the above-described capillary effects to remove the liner material(s), irrespective of fin pitch. Stated another way, the greater the thickness of the liner material in the trenches adjacent a particular fin, the greater will be the final fin height of the fin using the methods disclosed herein. The increased width due to additional liner material means that the cavity 30 during the recess etch process is wider, which does not slow the etch rate of the recess etch process as much as a narrower cavity 32 that results from the use of a thinner liner material(s), e.g., only the second liner layer 24. By selecting the appropriate target thickness 22T (FIG. 1B) and/or 24T (FIG. 1D) (either a specific number or a range) of the first and second liner layers 22, 24, the target final fin heights 20H1, 20H2 for the FinFET devices 100A, 100B, respectively, may be set and controlled using the methods disclosed herein. For example, using the methods disclosed herein, setting the target thickness 31 of the liner material(s) adjacent the fins 20A-C of the first FinFET device 100A at values A, B and C results in the fins 20A-C of the FinFET device 100 having a substantially uniform final fin height 20H1 of $X_1$, $X_2$ and $X_3$, respectively. Similarly, using the methods disclosed herein, setting the target thickness 33 of the liner material(s) adjacent the fins 20D-F of the second FinFET device 100B at values D, E and F results in the fins 20D-F of the second FinFET device 100B having a substantially uniform final fin height 20H2 of $Y_1$, $Y_2$ and $Y_3$, respectively. The relationship between the thicknesses of the liner materials 31, 33 and the associated final fin heights 20H1, 20H2 may vary depending upon a variety of factors, e.g., the materials used for the liner material(s), the etchants used in the recess etch process, the geometry of the trench 12, etc. Moreover, the relationship between the thicknesses of the liner materials 31, 33 and the final fin heights 20H1, 20H2 may not be linear. Accordingly, it is anticipated that, in implementing the present inventions, testing may be required to establish the exact parameters of, for example, liner material(s), liner thicknesses and etching process conditions and materials to arrive at a solution tailored for the first FinFET device 100A and the second FinFET device 100B of the integrated circuit product 100.

FIG. 1H depicts the integrated circuit product 100 at a point in fabrication wherein a timed etching process has been performed on the layer of insulating material 26 to reduce its thickness and thereby define a reduced-thickness layer of insulating material 26R. This process results in the formation of local isolation regions 37A, 37B (for the FinFET devices 100A, 100B, respectively) in the bottom of the trenches 12 that have slightly different configurations. The local isolation region 37A is generally comprised of a first generally "U" shaped dual liner configuration with a pair of spaced-apart substantially upstanding or vertical leg portions (the combined vertically oriented portions of the liners 22, 24) that are connected by a substantially horizontal portion (the combined horizontally oriented portions of the liners 22, 24). This first generally U-shaped liner defines a first liner cavity 39. A portion of the layer of insulating material 26R is positioned in the first liner cavity 39 defined. The local isolation region 37B is generally comprised of a second generally "U" shaped single liner configuration with a pair of spaced-apart substantially upstanding or vertical leg portions of just the second liner layer 24 that are connected by a substantially horizontal portion of the second liner layer 24. This second generally U-shaped liner defines a second liner cavity 41. A portion of the layer of insulating material 26R is positioned in the second liner cavity 41 defined.

The process of recessing the layer of insulating material 26 may be accurately controlled such that its post-recessing surface 26S may be positioned at any desired location. In the depicted example, the recessing etch process is performed for a sufficient duration such that the post-recessing surface 26S is positioned substantially even with the upper surfaces of the liner materials of the local isolation regions 37A. In practice, the post-etch surface 26S may be located at the level depicted in FIG. 1H or at a level corresponding to the dashed line 26X in FIG. 1H.

FIG. 1I depicts the integrated circuit product 100 at a later stage of manufacturing wherein illustrative final gate structures 40 comprised of an illustrative gate insulation layer 40A and an illustrative gate electrode 40B have been formed on the FinFET devices 100A, 100B. The final gate structure 40 may be formed using so-called "gate-first" or "replacement-gate" ("gate-last") techniques. An illustrative gate cap layer (not shown) may also be formed above the illustrative gate electrode 40B. The gate insulation layer 40A may be comprised of a variety of different materials, such as, for example, silicon dioxide, a so-called high-k (k greater than 10) insulation material (where k is the relative dielectric constant), etc. The thickness of the gate insulation layer 40A may also vary depending upon the particular application, e.g., it may have a thickness of about 1-2 nm. Similarly, the gate electrode 40B may also be of a variety of conductive materials, such as polysilicon or amorphous silicon, or it may be comprised of one or more metal layers that act as the gate electrode 40B. As will be recognized by those skilled in the art after a complete reading of the present application, the gate structure 40 of the FinFET devices 100A, 100B depicted in the drawings, i.e., the gate insulation layer 40A and the gate electrode 40B, is intended to be representative in nature. That is, the gate structure 40 may be comprised of a variety of different materials and it may have a variety of configurations. In one illustrative embodiment, a deposition process may be performed to form a gate insulation layer 40A comprised of silicon dioxide. Thereafter, the gate electrode material 40B and the gate cap layer material (not shown) may be deposited above the device 100 and the layers may be patterned using known photolithographic and etching techniques. In another illustrative embodiment, a conformal CVD or ALD process may be performed to form the depicted gate insulation layer 40A comprised of hafnium oxide. Thereafter, one or more metal layers (that will become the gate electrode 40B) and a gate cap layer material (not shown), e.g., silicon nitride, may be deposited above the FinFET devices 100A, 100B. Of course, the materials of construction for the FinFET devices 100A, 100B may be different. At this point, traditional manufacturing techniques may be performed to complete the manufacture of the integrated circuit product 100. For example, sidewall spacers (not shown) comprised of, for example, silicon nitride, may be formed adjacent the final gate structures 40. After the spacers are formed, if desired, an epitaxial growth process may be performed to form additional semiconducting material (not shown) on the portions of the fins 20 positioned outside of the spacers. Additional contacts and metallization layers may then be formed above the FinFET devices 100A, 100B using traditional techniques.

One illustrative method disclosed herein for forming an integrated circuit product 100 includes performing at least one first etching process through a patterned mask layer 16 to form a plurality of trenches 12 in the active regions 14A, 14B of the substrate 14 that defines at least a first plurality of fins, e.g., fins 20A-C, and a second plurality of fins, e.g., fins 20D-F, forming liner material (e.g., portions of the liners 22 and 24) adjacent to the first plurality of fins to a first thickness 31, forming liner material (e.g., portions of the liner 24) adjacent to the second plurality of fins to a second thickness 33 that is different from the first thickness, and forming insulating material 26 in the trenches adjacent the liner materials and above the mask layer 16. The method also includes performing at least one process operation to remove portions of the layer of insulating material 26 and to expose portions of the liner materials, performing at least one second etching process to remove portions of the liner materials and the mask layer 16 so as to expose at least one fin in the first plurality of fins to a first height 20H1 and at least one of the second plurality of fins to a second height 20H2 that is different from the first height, performing at least one third etching process on the insulating material to thereby define a reduced-thickness layer of insulating material 26R, and forming gate structures 40 around the first plurality of fins and the second plurality of fins.

Of course, the methods disclosed herein may also be employed in forming single or multiple fin devices. That is, in one embodiment, both of the devices 100A, 100B may be single fin FinFET devices, or only one of the devices 100A, 100B may be a single fin device while the other device may be a multiple fin device. Additionally, as noted above, the methods disclosed herein may also be employed to form the devices 100A, 100B where they are each comprised of multiple fins. In general, one illustrative method disclosed herein includes forming a patterned hard mask layer above a semiconductor substrate, performing at least one first etching process through the patterned hard mask layer to form a plurality of trenches in the substrate that define a first fin above a first active region of the substrate and a second fin formed above a second active region of the substrate, forming liner material adjacent to at least the first fin to a first thickness, forming liner material adjacent to at least the second fin to a second thickness that is different from the first thickness, forming a layer of insulating material in the trenches adjacent the liner materials and above the patterned hard mask layer, performing at least one process operation to remove portions of the layer of insulating material and to expose portions of the liner materials, performing at least one second etching process to remove portions of the liner materials and the patterned hard mask layer, wherein removal of the liner materials results in exposing the first fin to a first height and the second fin to a second height that is different from the first height, and performing at least one third etching process on the layer of insulating material to thereby define a reduced-thickness layer of insulating material.

One illustrative integrated circuit product 100 disclosed herein includes a first FinFET device 100A formed above a first active region 14A of a semiconductor substrate 14, wherein the first FinFET device 100A includes a first plurality of fins, e.g., fins 20A-C, wherein at least one of the first plurality of fins has a first fin height 20H1, a first trench positioned between the first plurality of fins, wherein the first trench has a first generally U-shaped liner material positioned in a bottom of the first trench, and a second FinFET device 100B formed above a second active region 14B of the semiconductor substrate, wherein the second FinFET device 100B includes a second plurality of fins, e.g., fins 20D-F, at least one of the second plurality of fins having a second fin height 20H2, wherein the first and second fin heights are different, and a second trench positioned between the second plurality of fins and wherein the second trench has a second generally U-shaped liner material positioned in a bottom of the second trench.

Another illustrative integrated circuit device disclosed herein includes a first FinFET device positioned above a first active region of a semiconductor substrate, wherein the first FinFET device includes at least one first fin having a first fin height, and a second FinFET device positioned above a second active region of the semiconductor substrate, wherein the second FinFET device includes at least one second fin having a second fin height, wherein the first and second fin heights are different.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming an integrated circuit product, comprising:
    forming a patterned hard mask layer above a semiconductor substrate;
    performing at least one first etching process through said patterned hard mask layer to form a plurality of trenches in said semiconductor substrate that define a first fin above a first active region of said substrate and a second fin above a second active region of said substrate;
    forming liner material adjacent to at least said first fin to a first thickness;
    forming liner material adjacent to at least said second fin to a second thickness that is different from said first thickness;
    forming a layer of insulating material in said trenches adjacent said liner materials and above said patterned hard mask layer;
    performing at least one process operation to remove portions of said layer of insulating material and to expose portions of said liner materials;
    performing at least one second etching process to remove portions of said liner materials and said patterned hard mask layer, wherein removal of said liner materials results in exposing said first fin to a first height and said second fin to a second height that is different from said first height; and
    performing at least one third etching process on said layer of insulating material to thereby define a reduced-thickness layer of insulating material.

2. A method of forming a FinFET device, comprising:
    forming a patterned hard mask layer above a semiconductor substrate;
    performing at least one first etching process through said patterned hard mask layer to form a plurality of trenches in said semiconductor substrate that define a first plurality of fins above a first active region of said substrate and a second plurality of fins above a second active region of said substrate;
    forming a first liner layer in said plurality of trenches, above said hard mask and adjacent to at least said first and second plurality of fins;
    performing a second etching process to remove at least portions of said first liner layer positioned adjacent said second plurality of fins;
    forming a second liner layer above said first liner layer and adjacent to said second plurality of fins;
    forming a layer of insulating material in said trenches above said first and second liner layers and above said patterned hard mask layer;
    performing a process operation to remove portions of said layer of insulating material and to expose portions of at least said second liner layer;
    performing at least one third etching process to remove portions of said first and second liner layers and said patterned hard mask layer, wherein removal of portions of said first and second liner layers results in exposing at least one of said first plurality of fins to a first height and exposing at least one of said second plurality of fins to a second height that is less than said first height; and
    performing at least one fourth etching process on said layer of insulating material to thereby define a reduced-thickness layer of insulating material.

3. The method of claim 2, wherein said first plurality of fins are for a first FinFET device of a first type and said second plurality of fins are for a second FinFET device of a second type that is opposite to said first type.

4. The method of claim 2, wherein said first plurality of fins are for a first FinFET device and said second plurality of fins are for a second FinFET device and wherein said first FinFET device and said second FinFET device are of a same type.

5. The method of claim 2, further comprising:
    forming a first gate structure around said first plurality of fins; and
    forming a second gate structure around said second plurality of fins.

6. The method of claim 2, wherein said first and second liner layers have the same approximate thickness.

7. The method of claim 2, wherein said first and second liner layers are made of the same material.

8. A method of forming an integrated circuit product, comprising:
    forming a patterned hard mask layer above a semiconductor substrate;
    performing at least one first etching process through said patterned hard mask layer to form a plurality of trenches in said semiconductor substrate that define a first plurality of fins above a first active region of said substrate and a second plurality of fins above a second active region of said substrate;

forming liner material adjacent to at least said first plurality of fins to a first thickness;

forming liner material adjacent to at least said second plurality of fins to a second thickness that is different from said first thickness;

forming a layer of insulating material in said trenches adjacent said liner materials and above said patterned hard mask layer;

performing at least one process operation to remove portions of said layer of insulating material and to expose portions of said liner materials;

performing at least one second etching process to remove portions of said liner materials and said patterned hard mask layer, wherein removal of said liner materials results in exposing at least one of said first plurality of fins to a first height and at least one of said second plurality of fins to a second height that is different from said first height; and performing at least one third etching process on said layer of insulating material to thereby define a reduced-thickness layer of insulating material.

9. The method of claim 8, wherein said first plurality of fins are for a first FinFET device of a first type and said second plurality of fins are for a second FinFET device of a second type that is opposite to said first type.

10. The method of claim 8, wherein said first plurality of fins are for a first FinFET device and said second plurality of fins are for a second FinFET device and wherein said first FinFET device and said second FinFET device are of a same type.

11. The method of claim 8, further comprising:
forming a first gate structure around said first plurality of fins; and
forming a second gate structure around said second plurality of fins.

12. The method of claim 8, wherein said patterned hard mask layer is comprised of silicon nitride, said liner material is comprised of aluminum oxide and said layer of insulating material is comprised of silicon dioxide.

13. The method of claim 8, wherein performing said process operation comprises performing a chemical mechanical polishing process operation.

14. The method of claim 8, wherein said first thickness is greater than said second thickness and said first height is greater than said second height.

15. The method of claim 8, wherein said first thickness is less than said second thickness and said first height is less than said second height.

16. The method of claim 8, wherein said liner material positioned adjacent said first plurality of fins comprises multiple layers of liner material, said liner material positioned adjacent said second plurality of fins comprises a single layer of liner material, said first thickness is greater than said second thickness and said first height is greater than said second height.

17. The method of claim 8, wherein said liner material positioned adjacent said first plurality of fins comprises a single layer of liner material, said liner material positioned adjacent said second plurality of fins comprises a single layer of liner material, said first thickness is greater than said second thickness and said first height is greater than said second height.

18. The method of claim 8, wherein said liner materials are made of the same material.

19. The method of claim 8, wherein said second etching process results in said liner material adjacent said first plurality of fins having a first generally U-shaped liner positioned at a bottom of each of said trenches adjacent said first plurality of fins that exposes at least one of said first plurality of fins to said first height.

20. The method of claim 19, wherein said second etching process results in said liner material adjacent said second plurality of fins having a second generally U-shaped liner positioned at a bottom of each of said trenches adjacent said second plurality of fins that exposes at least one of said second plurality of fins to said second height.

* * * * *